United States Patent
Lee et al.

(10) Patent No.: US 11,176,294 B2
(45) Date of Patent: Nov. 16, 2021

(54) METHOD OF DESIGNING COILS FOR TRANSMITTING OR RECEIVING POWER WIRELESSLY

(71) Applicant: HITACHI-LG DATA STORAGE KOREA, INC., Seoul (KR)

(72) Inventors: Hogil Lee, Seoul (KR); Hyunwook Ha, Seoul (KR)

(73) Assignee: HITACHI-LG DATA STORAGE KOREA, INC., Seoul (KR)

(*) Notice: Subject to any disclaimer, the term of this patent is extended or adjusted under 35 U.S.C. 154(b) by 198 days.

(21) Appl. No.: 16/424,062

(22) Filed: May 28, 2019

(65) Prior Publication Data
US 2019/0370427 A1 Dec. 5, 2019

(30) Foreign Application Priority Data
Jun. 5, 2018 (KR) .................. 10-2018-0065102

(51) Int. Cl.
  *G06F 30/30* (2020.01)
  *H02J 7/02* (2016.01)
  *H02J 50/10* (2016.01)

(52) U.S. Cl.
  CPC .............. *G06F 30/30* (2020.01); *H02J 7/025* (2013.01); *H02J 50/10* (2016.02)

(58) Field of Classification Search
  CPC ...... H01F 27/2804; H01F 38/14; H01F 17/04; H01F 2027/2809; H01F 27/36; H01F 27/38; H02J 50/10; H02J 7/025; G06F 30/30
  See application file for complete search history.

(56) References Cited

U.S. PATENT DOCUMENTS

| 10,447,065 B2 | 10/2019 | Hwang et al. | |
|---|---|---|---|
| 2012/0154098 A1* | 6/2012 | Shimode | H01F 30/06 336/212 |
| 2018/0198310 A1* | 7/2018 | Hwang | H01F 27/22 |
| 2019/0097448 A1* | 3/2019 | Partovi | H01F 38/14 |
| 2021/0044147 A9* | 2/2021 | Partovi | H02J 50/80 |

FOREIGN PATENT DOCUMENTS

| CN | 107852040 A | 3/2018 | |
|---|---|---|---|
| JP | 2003-61266 A | 2/2003 | |
| JP | 2003-173921 A | 6/2003 | |
| JP | 2009-136048 A | 6/2009 | |
| JP | 2009136048 A * | 6/2009 | .............. H02J 17/00 |
| JP | 2012-134307 A | 7/2012 | |
| JP | 2012-164929 A | 8/2012 | |
| JP | 2018-530288 A | 10/2018 | |
| WO | WO 2017/014430 A | 1/2017 | |

* cited by examiner

*Primary Examiner* — Jay Patidar
(74) *Attorney, Agent, or Firm* — Birch, Stewart, Kolasch & Birch, LLP

(57) ABSTRACT

Provided is a method of designing coils for transmitting or receiving power wirelessly. The method includes determining a length and a width of a core on which a first coil and second and third coils are disposed, and determining radii and a number of turns of the first to third coils, wherein each of the second and third coils overlaps one side of the first coil. The method further includes determining an operating frequency of the coils and a thickness of the core, determining an optimal thickness of a foil constituting the first to third coils by measuring AC resistances of the first to third coils, and determining an optimal width of the foil by measuring the AC resistances of the first to third coils, whereby an enhanced configuration of the coils is provided.

7 Claims, 10 Drawing Sheets

| Center coil AC resistance [mΩ] | | | | | |
|---|---|---|---|---|---|
| $W_c$ | 6 Oz | 9 Oz | 12 Oz | 15 Oz | 18 Oz |
| 0.3mm | 469 | 325 | 255 | 218 | 202 |
| 0.4mm | 369 | 269 | 226 | 206 | 201 |
| 0.5mm | 325 | 254 | 234 | 233 | 235 |
| 0.6mm | 309 | 264 | 262 | 266 | 286 |
| 0.7mm | 322 | 300 | 305 | 337 | 354 |

FIG. 11

| Side coil AC resistance [mΩ] | | | | | |
|---|---|---|---|---|---|
| $W_c$ | 6 Oz | 9 Oz | 12 Oz | 15 Oz | 18 Oz |
| 0.3mm | 438 | 309 | 248 | 221 | 213 |
| 0.4mm | 346 | 256 | 224 | 209 | 213 |
| 0.5mm | 305 | 243 | 234 | 236 | 242 |
| 0.6mm | 292 | 252 | 256 | 264 | 293 |
| 0.7mm | 306 | 288 | 296 | 333 | 348 |

METHOD OF DESIGNING COILS FOR TRANSMITTING OR RECEIVING POWER WIRELESSLY

This application claims the benefit of priority under 35 U.S.C. § 119(a) to Korean Patent Application No. 10-2018-0065102 filed on Jun. 5, 2018, which is incorporated by reference herein in its entirety.

BACKGROUND

Field

This disclosure relates to a coil for transmitting or receiving power wirelessly.

Related Art

With the development of communication and information processing technology, use of smart terminals such as a smart phone, and the like has gradually increased and at present, a charging scheme generally applied to the smart terminals is a scheme that directly connects an adapter connected to a power supply to the smart terminal to charge the smart phone by receiving external power or connects the adapter to the smart terminal through a USB terminal of a host to charge the smart terminal by receiving USB power.

In recent years, in order to reduce inconvenience that the smart terminal needs to be directly connected to the adapter or the host through a connection line, a wireless charging scheme that wirelessly charges a battery by using magnetic coupling without an electrical contact has been gradually applied to the smart terminal.

When wirelessly supplying or receiving electric energy according to an inductive coupling scheme, a primary coil and a secondary coil of a Litz wire or copper wire are equipped in a transmitting apparatus and a receiving device to form a power transmitting channel. It may be advantageous in terms of cost to form a coil by copper.

However, there is a limit to reduce the size of the coil due to the thickness of the coil wire, and the limit may be overcome to some extent by forming a coil pattern according to Printed Circuit Board PCB manufacturing method.

When power is transmitted by operating the transmitting coil of the copper coil or the PCB pattern at a high frequency of several hundreds of kHz, there is a problem that an AC resistance increases due to the skin effect of the coil wire or proximity effect between magnetic lines. If increasing the thickness and width of the coil wire or the PCB copper foil or implementing the coil in a multilayer structure in order to solve this problem, the AC resistance becomes larger and the size of an entire transmitting coil becomes larger.

SUMMARY

Accordingly, an objective of the present invention is to provide a method of designing a coil in a PCB manufacturing scheme in order to minimize an AC resistance.

Another objective of the present invention is to provide a method of designing a coil the inductance of which can be a desired value in consideration of the skin effect and the proximity effect.

A method of designing coils for transmitting or receiving power wirelessly may comprise: (a) determining a length and a width of a core on which a first coil and second and third coils each of which overlaps one of both sides of the first coil are disposed, and radii and a number of turns of the first to third coils; (b) determining an operating frequency and a thickness of the core in consideration of a target output power and an amplitude of a magnetic flux density; (c) determining an optimal thickness of a foil constituting the first to third coils, by measuring minimum AC resistances of the first to third coils while changing the thickness of the foil; and (d) determining an optimal width of the foil, by measuring minimum AC resistances of the first to third coils while changing the width of the foil.

In an embodiment, the (c) step may change the thickness of the foil in a state that a height difference between a first foil of the first coil and a second foil of the second or third coil is fixed.

In an embodiment, the (d) step may change the width of the foil in a state that a distance between adjacent foils is fixed.

In an embodiment, it may be assumed that a coil has a same inductance even if the thickness of the foil is changed or the width of the foil is changed.

In an embodiment, the first to third coils may be formed in a double-sided PCB manufacturing method.

In an embodiment, the thickness and width of the foil which make the minimum AC resistance 200 to 300 mΩ may be 9 to 18 Oz and 0.4 to 0.6 mm, when satisfy a target inductance of the first to third coils is 11 μH, length and width of the core are 92 mm and 56 mm, the radii are 22 mm, the number of turns is 11, a target output power is 15 W, the operating frequency is 111 kHz and a thickness of the core is 1.5 mm.

A wireless power transmitting apparatus according to another embodiment of the present invention may comprise: multiple transmitting coils for changing a magnetic field by an alternating current, including a first coil and second and third coils each of which overlaps one of both sides of the first coil; a shielding part for limiting propagation of the magnetic field generated in the multiple transmitting coils; and a case for surrounding the multiple transmitting coils and the shielding part, wherein thickness and width of a foil constituting the first to third coils are 9 to 18 Oz and 0.4 to 0.6 mm.

Accordingly, it becomes possible to design coils for wireless power transmission and reception with reduced AC resistance and desired inductance.

And, it is possible to manufacture coils which are thinner and lighter than the coil using Litz wire, so it is possible to thin the product using the coils. In addition, connecting works, tube-shrinking works, pressing works, and the like, which are involved in manufacturing the coil by using Litz wire can be omitted, thereby simplifying a coil manufacturing process, improving reproducibility and reducing manufacturing time.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 10 and 11 show a combination of the thickness and the width of the coil satisfying the AC resistance of a predetermined reference in a table.

DETAILED DESCRIPTION

Hereinafter, an embodiment of a coil for wireless power transmitting according to the present invention will be described in detail with reference to the accompanying drawings.

Figure 1:
FIG. 1 conceptually illustrates that power is wirelessly transmitted from a power transmitting apparatus to an electronic device, FIG. 2 conceptually illustrates a circuit configuration of a power conversion unit of a transmitting apparatus for wirelessly transmitting power in an electromagnetic induction scheme.

FIG. 1 conceptually illustrates that power is wirelessly transmitted from a wireless power transmitting apparatus to an electronic device.

The wireless power transmitting apparatus 100 may be a power transferring apparatus wirelessly transferring power required by a wireless power receiving apparatus or an electronic device 200, or a wireless charging apparatus for charging a battery by wirelessly transferring power. Or the wireless power transmitting apparatus 100 may be implemented by one of various types of apparatuses transferring power to the electronic device 200 requiring power with non-contact.

The electronic device 200 may be operable by wirelessly receiving power from the wireless power transmitting apparatus 100 and charge a battery by using wirelessly received power. The electronic device that wirelessly receives power may include portable electronic devices, for example, a smart phone, a tablet computer, a multimedia terminal, an input/output device such as a keyboard, a mouse, a video or audio auxiliary device, a secondary battery, and the like.

Power may be wirelessly transmitted by an inductive coupling scheme based on an electromagnetic induction phenomenon by a wireless power signal generated by the wireless power transmitting apparatus 100. That is, resonance is generated in the electronic device 200 by the wireless power signal transmitted by the wireless power transmitting apparatus 100 and power is transferred from the wireless power transmitting apparatus 100 to the electronic device 200 without contact by the resonance. A magnetic field is changed by an AC current in a primary coil and current is induced to a secondary coil by the electromagnetic induction phenomenon to transfer power.

When the intensity of the current that flows on a primary coil of the wireless power transmitting apparatus 100 is changed, the magnetic field passing through the primary coil (or a transmitting Tx coil or a first coil) is changed by the current and the changed magnetic field generates induced electromotive force at a secondary coil (or a receiving Rx coil or a second coil) in the electronic device 200.

When the wireless power transmitting apparatus 100 and the electronic device 200 are disposed such that the transmitting coil at the wireless power transmitting apparatus 100 and the receiving coil at the electronic device 200 come close to each other and the wireless power transmitting apparatus 100 controls the current of the transmitting coil to be changed, the electronic device 200 may supply power to a load such as a battery by using the electromotive force induced to the receiving coil.

A mark indicating a location where the electronic device is to be laid may be displayed on the top of the interface surface of the wireless power transmitting apparatus 100. The mark may indicate the position of the electronic device which makes the arrangement between the primary coil mounted on the bottom of the interface surface and the secondary coil suitable. A protruded structure for guiding the location of the electronic device may be formed on the top of the interface surface. And a magnetic body may be formed on the bottom of the interface surface so that the primary coil and the secondary coil can be guided by an attractive force with a magnetic body of the other pole provided inside the electronic device.

Figure 2:
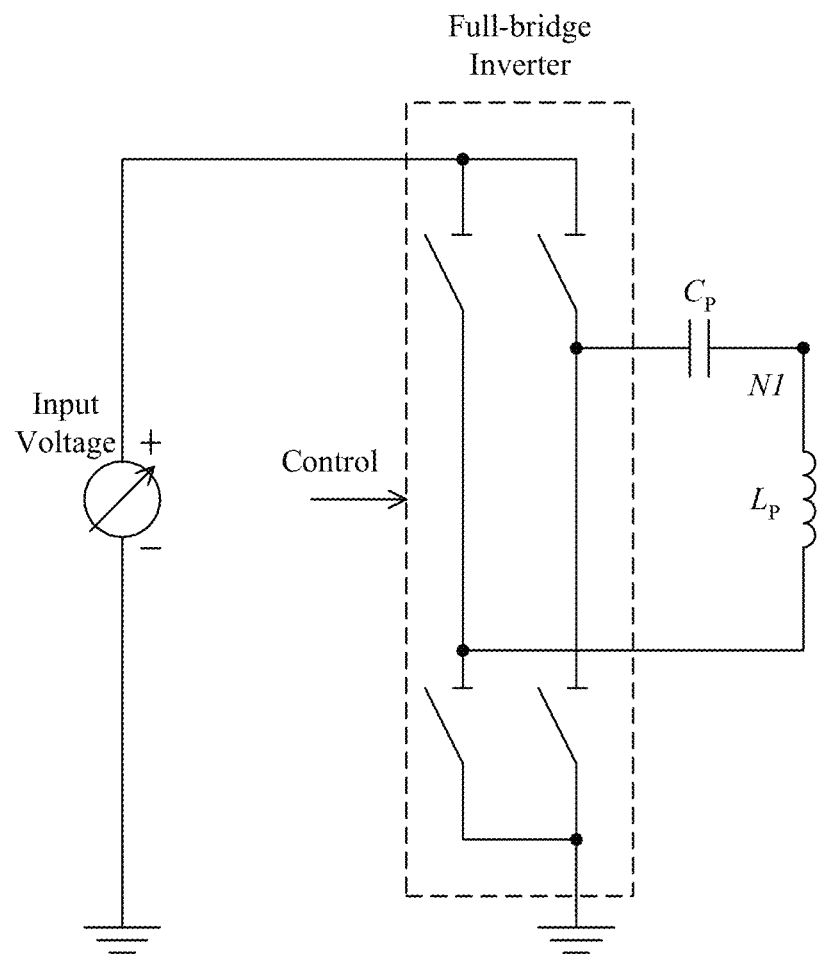

FIG. 2 conceptually illustrates a circuit configuration of a power conversion unit of a transmitting apparatus for wirelessly transmitting power in an electromagnetic induction scheme.

The wireless power transmitting apparatus may include a power conversion unit generally including a power source, an inverter, and a resonance circuit. The power source may be a voltage source or a current source and the power conversion unit converts the power supplied from the power source into a wireless power signal and transfers the converted wireless power signal to a receiving device. The wireless power signal is formed in the form of the magnetic field or an electronic magnetic field having a resonance characteristic. And, the resonance circuit includes a coil generating the wireless power signal.

The inverter converts a DC input into an AC waveform having a desired voltage and a desired frequency through switching elements and a control circuit. And, in FIG. 2 a full-bridge inverter is illustrated and other types of inverters including a half-bridge inverter, and the like are also available.

The resonance circuit includes a primary coil $L_p$ and a capacitor $C_p$ to transmit power based on a magnetic induction scheme. The coil and the capacitor determine a basic resonance frequency of power transmission. The primary coil forms the magnetic field corresponding to the wireless power signal with a change of current and may be implemented in a flat form or a solenoid form.

The AC current converted by the inverter drives the resonance circuit, and as a result, the magnetic field is formed in the primary coil. By controlling the on/off timings of included switches, the inverter generates AC having a frequency close to the resonance frequency of the resonance circuit to increase transmission efficiency of the transmitting apparatus. The transmission efficiency of the transmitting apparatus may be changed by controlling the inverter.

Figure 3:
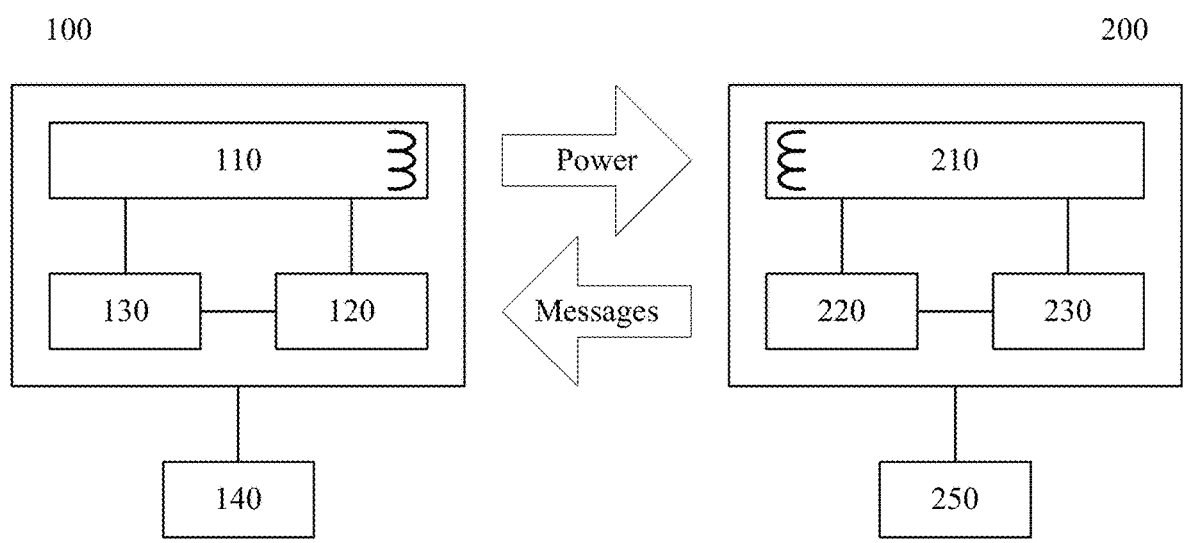
FIG. 3 illustrates a configuration for a wireless power transmitting apparatus and a wireless power receiving device to send and receive power and messages.

FIG. 3 illustrates a configuration for a wireless power transmitting apparatus and a wireless power receiving device to send and receive power and messages.

Since the power conversion unit just transmits power unilaterally regardless of a receiving state of the receiving device, a configuration for receiving feedback associated with the receiving state from the receiving device is required in the wireless power transmission apparatus in order to transmit power in accordance with the state of the receiving device.

The wireless power transmitting apparatus 100 may include a power conversion unit 110, a first communication unit 120, a first control unit 130, and a power supply unit 140. And, the wireless power receiving device 200 may include a power receiving unit 210, a second communication unit 220, and a second control unit 230 and may further include a load 250 to which received power is to be supplied.

The power conversion unit 110 includes the inverter and the resonance circuit of FIG. 2 and may further include a circuit to control characteristics including a frequency, voltage, current, and the like used to form the wireless power signal.

The first communication unit 120, connected to the power conversion unit 110, may demodulate the wireless power signal modulated by the receiving device 200 wirelessly receiving power from the transmitting apparatus 100 in the magnetic induction scheme, thereby detecting a power control message.

The first control unit 130 determines one or more characteristics among an operating frequency, voltage, and current of the power conversion unit 110 based on the message detected by the communication unit 120 and controls the power conversion unit 110 to generate the wireless power signal suitable for the message. The first communication unit 120 and the first control unit 130 may be configured as one module.

The power receiving unit 210 may include a matching circuit, including the secondary coil and a capacitor, which generates the inductive electromotive force according to the change of the magnetic field generated from the primary coil of the power conversion unit 110, and may further include a rectification circuit that rectifies the AC current that flows on the secondary coil to output DC current.

The second communication unit 220, connected to the power receiving unit 210, may change the wireless power signal between the transmitting apparatus and the receiving device by adjusting the load of the power receiving unit in accordance with a method of adjusting a resistive load at DC and/or a capacitive load at AC to transmit the power control message to the transmitting apparatus.

The second control unit 230 controls individual components included in the receiving device. The second control unit 230 may measure an output of the power receiving unit 210 in a current or voltage form and control the second communication unit 220 based on the measured output to transfer the power control message to the wireless power transmitting apparatus 100. The message may direct the wireless power transmitting apparatus 100 to start or terminate the transmission of the wireless power signal and to control characteristics of the wireless power signal.

The wireless power signal formed by the power conversion unit 110 is received by the power receiving unit 210, and the second control unit 230 of the receiving device controls the second communication unit 220 to modulate the wireless power signal. The second control unit 230 may perform a modulation process to change the amount of power received from the wireless power signal by changing the reactance of the second communication unit 220. When the amount of power received from the wireless power signal is changed, a current and/or voltage of the power conversion unit 110 forming the wireless power signal is also changed and the first communication unit 120 of the wireless power transmitting apparatus 100 may sense the change in the current and/or voltage of the power conversion unit 110 and perform a demodulation process.

The second control unit 230 generates a packet including a message to be transferred to the wireless power transmitting apparatus 100 and modulates the wireless power signal to include the generated packet. The first control unit 130 may acquire the power control message by decoding the packet extracted through the first communication unit 120. The second control unit 230 may transmit a message for requesting a change of the characteristic of the wireless power signal based on the amount of power received through the power receiving unit 210 in order to control to-be-received power.

Figure 4:
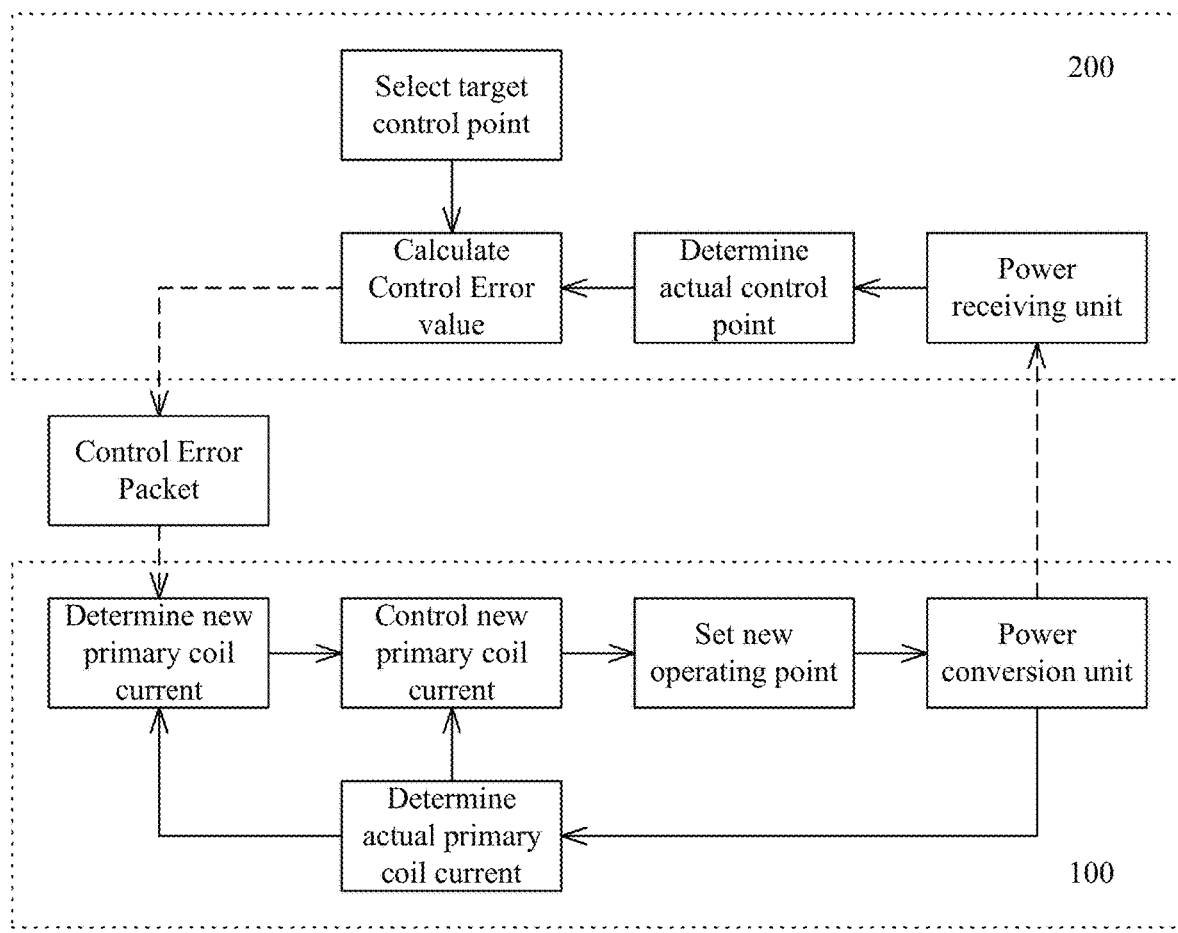
FIG. 4 is a block diagram of a loop for controlling power transmission between a wireless power transmitting apparatus and a wireless power receiving device.

FIG. 4 is a block diagram of a loop for controlling power transmission between a wireless power transmitting apparatus and a wireless power receiving device.

Current is induced in the power receiving unit 210 of the receiving device 200 according to the change of the magnetic field generated by the power conversion unit 110 of the transmitting apparatus 100 and power is transmitted. The second control unit 230 of the receiving device selects a desired control point, that is, a desired output current and/or voltage and determines an actual control point of the power received through the power receiving unit 210.

The second control unit 230 calculates a control error value by using the desired control point and the actual control point while the power is transmitted and may take the difference between, for example, two output voltages or two output currents as the control error value. When less power is required to reach the desired control point, the control error value may be determined to be, for example, a minus value, and when more power is required to reach the desired control point, the control error value may be determined to be a plus value. The second control unit 230 may generate a packet including the calculated control error value calculated by changing the reactance of the power receiving unit 210 with time through the second communication unit 220 to transmit the packet to the transmitting apparatus 100.

The first communication unit 120 of the transmitting apparatus detects a message by demodulating the packet included in the wireless power signal modulated by the receiving device 200 and may demodulate a control error packet including the control error value.

The first control unit 130 of the transmitting apparatus may acquire the control error value by decoding the control error packet extracted through the first communication unit 120 and determine a new current value for transmitting power desired by the receiving device by using an actual current value which actually flows on the power conversion unit 110 and the control error value.

When the process of receiving the control error packet from the receiving device is stabilized, the first control unit 130 controls the power conversion unit 110 so that an operating point reaches a new operating point so an actual current value which flows on the primary coil becomes a new current value and a magnitude, a frequency, a duty ratio, or the like of an AC voltage applied to the primary coil becomes a new value. And, the first control unit 130 controls the new operating point to be continuously maintained so as for the receiving device to additionally communicate control information or state information.

A portion of the interface surface through which a high efficiency magnetic field can pass when the transmitting apparatus 100 wirelessly transmits power to the receiving device 200 may be referred to as an active area. In case that a plurality of the primary coils are used in order to widen the active area, since a number of drive circuits equal to the number of the primary coils are required and the control over a plurality of primary coils is complicated, the cost of the transmitting apparatus, that is, the wireless charger, is increased during commercialization. Further, in order to expand the active area, even when a scheme of changing the location of the primary coil is applied, since it is necessary to provide a transport mechanism for moving the location of the primary coil, there is a problem that a volume and a weight increase and manufacturing cost increases.

A method that extends the active area even with one primary coil of which the location is fixed is effective. However, when the size of the primary coil is just increased, a magnetic flux density per area decreases and magnetic coupling force between the prmary coil and the secondary coil is weakened. As a result, the active area is not so increased as expected and the transmission efficiency is also lowered.

As such, it is important to determine an appropriate shape and an appropriate size of the primary coil in order to extend the active area and improve the transmission efficiency. A multi-coil scheme adopting two or more primary coils may be an effective method that extends the active area of the wireless power transmitting apparatus.

Figure 5:
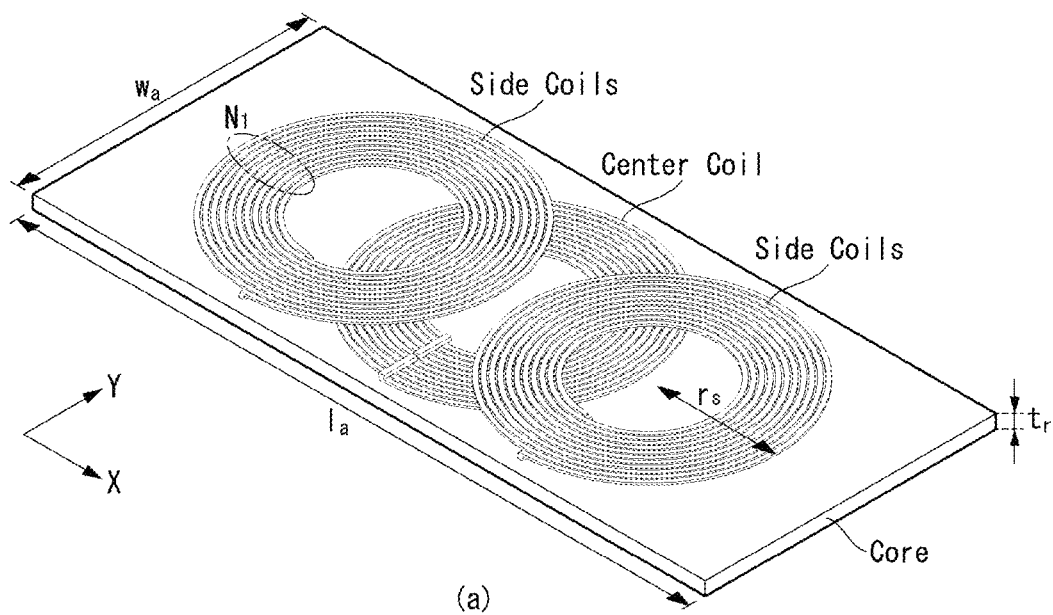
FIG. 5 shows multiple coils of circular and rectangular shapes.
Figure 5:
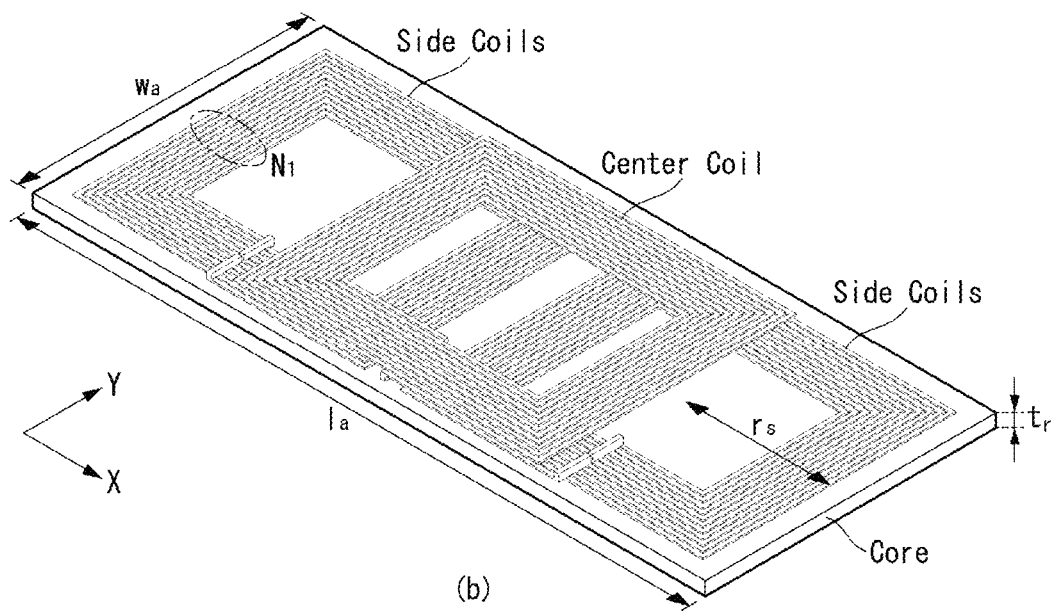

FIG. 5 shows multiple coils of circular and rectangular shapes. One center coil (or middle coil) and two side coils are mounted on a core. Each coil may be spirally wound in a circular or rectangular shape, and the side coils may be arranged to overlap with the center coil. In FIG. 5, "$l_a$" is the length of the core in the direction along which 3 coils are arranged (X direction), "$w_a$" is the width of the core in the direction perpendicular to the X direction (Y direction), "$t_r$" is the thickness of the core, "N1" is the number of winding of the coil wire, and "$r_s$" is the radius of the coil.

Figure 6:
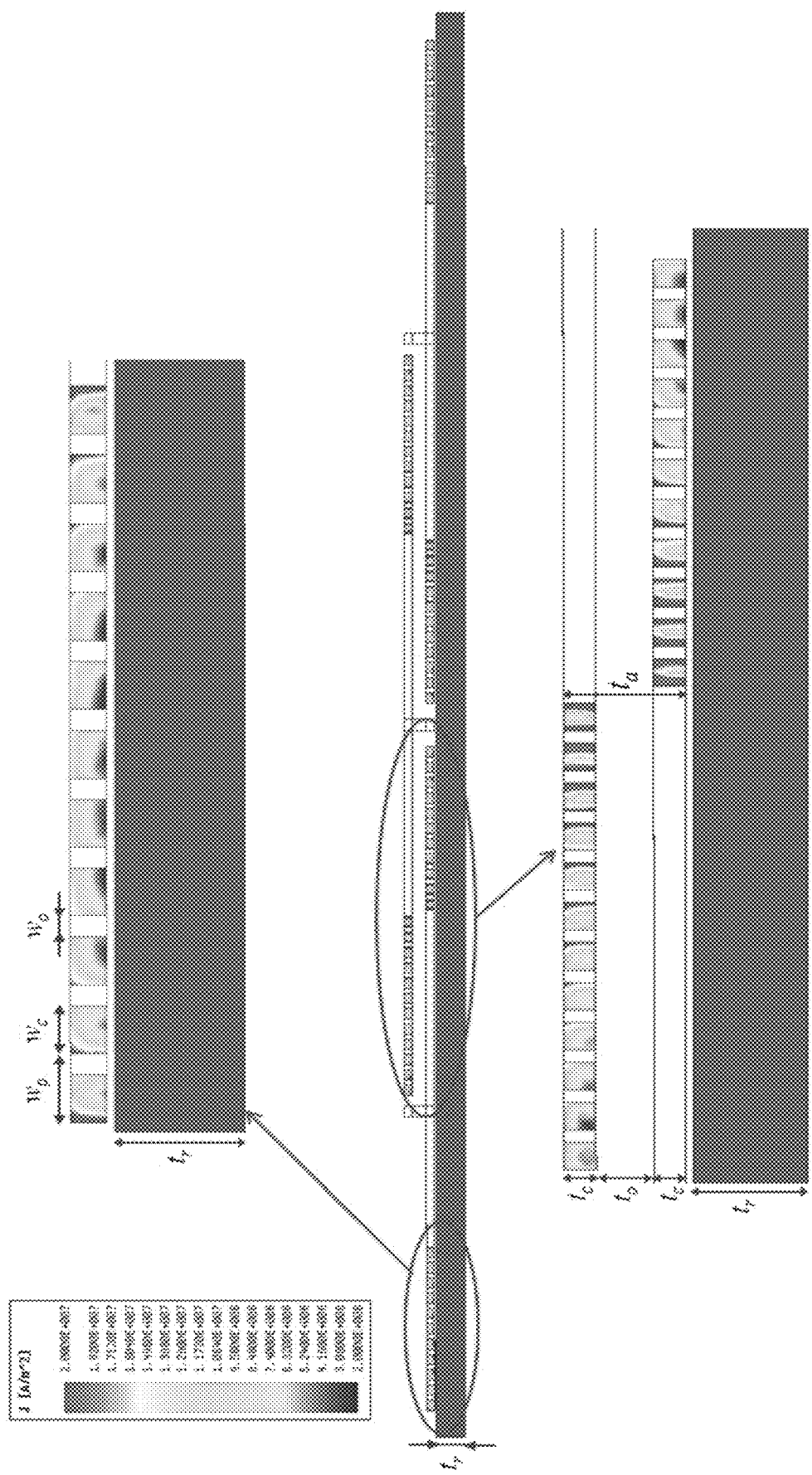
FIG. 6 shows a current density distribution in a coil cross section when multiple coils constituted by three coils are driven at a high frequency.

FIG. 6 shows a current density distribution in a coil cross section when multiple coils constituted by three coils are driven at a high frequency. In FIG. 6, "$t_c$," "$w_c$" and "$w_p$" are respectively the thickness, the width and the pitch of the wire constituting the coil, that is the foil. And "$t_r$" is the thickness of the core, "$t_0$" is the height difference between the center coil and the side coils, and "$t_a$" is the sum of the height difference "$t_0$", the thickness "$t_c$" of the center coil and the thickness "$t_c$" of the side coil. And, "$w_o$" is the spacing between neighboring wires. When driving the multi coils for power transmitting at a high frequency, a current tends to flow to the outer coil where no coil is placed in the neighborhood due to the proximity effect between neighboring lines, and as a result, an AC resistance becomes large and transmission efficiency becomes low when power is transmitted.

When driving a wireless power transmitting coil or a wireless power receiving coil at a high frequency, the AC resistance becomes larger and impedance becomes small due to the skin effect and the proximity effect. When making the coil using a conventional Litz coil or a copper coil, since the radius of the coil is constant, it is difficult to obtain the AC resistance or impedance of a desired level.

In case of making the coil with a foil pattern according to a PCB manufacturing scheme, there was no detailed method of designing the foil pattern to make the AC resistance or impedance be a desired value while considering the skin effect and proximity effect.

The present invention may provide a method of designing an optimal foil pattern in order for a coil to have desired AC resistance and impedance when making the coil for wirelessly transmitting or receiving power according to a PCB manufacturing scheme.

Figure 7:
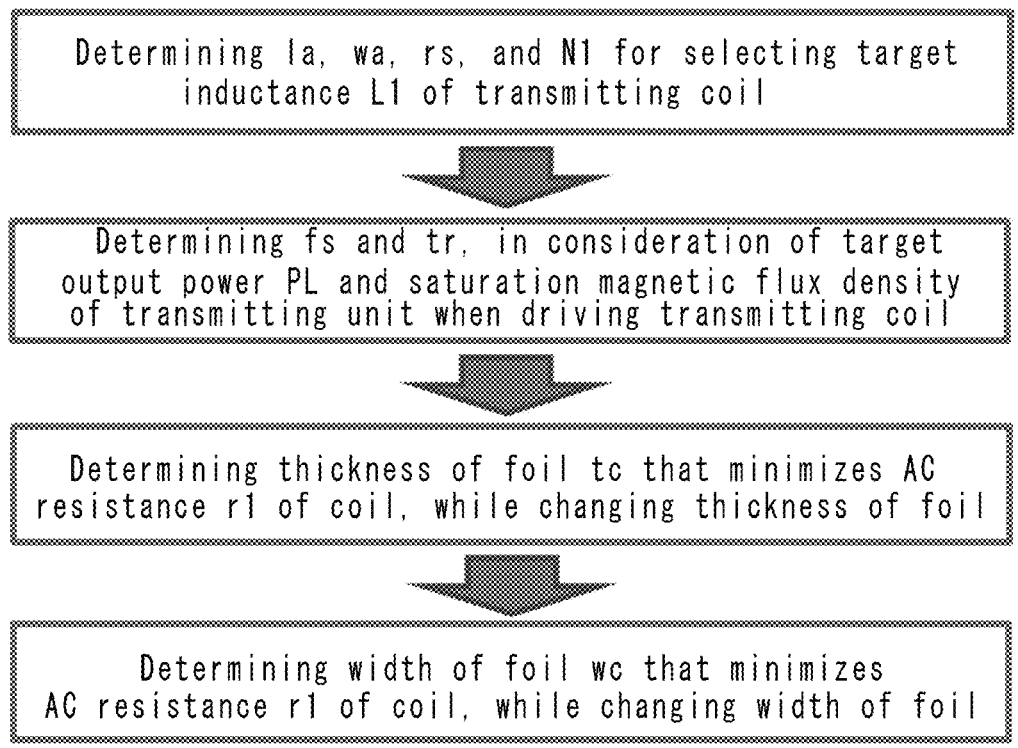
FIG. 7 shows a procedure of designing a wire for wireless power transmitting/receiving according to the present invention.

FIG. 7 shows a procedure of designing a wire for wireless power transmitting/receiving according to the present invention.

In the coil according to the present invention, multiple coils include three coils arranged in a X direction including one center coil and two side coils, and a part of the side coils are disposed on the core in a state of overlapping with the center coil. Each coil may be wound in a circular or rectangular shape from inner circumference to outer circumference or from outer circumference to inner circumference in a spiral manner.

Among the values to be determined according to the coil designing method of the present invention, the values related to the core on which the multiple coils are laid may include the length ($l_a$ in FIG. 5) of the core in the direction along which 3 coils are arranged (X direction in FIG. 5), the width ($w_a$ in FIG. 5) of the core in the direction perpendicular to the X direction (Y direction in FIG. 5), and the thickness ($t_r$ in FIGS. 5 and 6) of the core.

And, among the values to be determined according to the coil designing method, the values related to the coil may include the thickness ($t_c$ in FIG. 6), the width ($w_c$ in FIG. 6) and the pitch ($w_p$ in FIG. 6) of the wire constituting the coil, that is the foil, the height difference ($t_0$ in FIG. 6) between the center coil and the side coils, the number of turns ($N_1$ in FIG. 5) of spirally winding the wire, the radius ($r_s$ in FIG. 5) of the coil wound in a spiral, and so on.

In order to select a target inductance $L_1$ of the transmitting coil of a wireless power system, the length $l_a$ and the width $w_a$ of the core on which three coils are laid, and the radius $r_s$ and the number of turns $N_1$ of the coil are determined.

When driving a transmitting coil in order to wirelessly transmit power, an operating frequency $f_s$ and the thickness $t_r$ of the core are determined, in consideration with the amplitude ($B_1 < B_{1,max} \approx 0.3$ T) of the magnetic flux density of a transmitting core based on a target output power PL and the saturation magnetic flux density of a transmitting unit.

In the coil according to the present invention, since the copper toil needs to be formed of two layers in the portion where the center coil and two side coils are overlapped, the double-sided PCB method should be used to form the coil wire, or copper foil. An optimal thickness $t_{c,op}$ of the foil which minimize an AC resistance $r_1$ of the coil may be selected, by measuring the AC resistance $r_1$ of the coil while changing the thickness $t_c$ of the foil of the coil in a state that the gap or the height difference $t_0$ between two coils is fixed. At this time, it is assumed that the inductance $L_1$ of the coil is constant even though the thickness $t_c$ of the foil is changed.

Since the AC resistance increases due to the skin effect as the thickness $t_c$ of the foil get smaller and the AC resistance increases due to the proximity effect as the thickness $t_c$ of the foil get larger, it is possible to determine the optimal thickness $t_{c,op}$ of the foil which compromises both the skin effect and the proximity effect.

After determining the thickness of the foil, an optimal width $w_{c,op}$ of the foil which minimize the AC resistance to be $r_{1wmin|wc,op}$ of the coil may be selected, by measuring the AC resistance $r_1$ of the coil while changing the width $w_c$ of the foil in a state that the pitch or interval ($w_p = w_c + w_o$) between adjacent two foils is fixed. It is assumed that the inductance $L_1$ of the coil is constant even though the width $w_c$ of the foil is changed Since the AC resistance increases due to the skin effect as the width $w_c$ of the foil get smaller and the AC resistance increases due to the proximity effect as the width $w_c$ of the foil get larger, it is possible to determine the optimal width $w_{c.op}$ of the foil which compromises both the skin effect and the proximity effect.

With this process, it is possible to determine the optimum thickness and width of the copper foil which minimize the AC resistance of the multiple coils manufactured by a PCB method.

For example, when the target value of the inductance L1 of the multiple transmitting coils for the charger for wirelessly transmitting power to a mobile terminal is set to 11 µH, the length $l_a$ of the core on which the coils are placed may be set 92 mm, the width $w_a$ of the core may be set 56 mm, the radius $r_s$ of the coil may be set 22 mm and the number $N_1$ of winding the coil wire may be set 11.

In order to satisfy the target that the target output power PL is 15 W and an internal magnetic flux density is equal to or lower than the saturation magnetic flux density, the operating frequency $f_s$ and the thickness of the core $t_r$ may be determined to be 111 kHz and 1.5 mm respectively.

Assuming that the width of the copper foil $w_c$ is 0.5 mm, the thickness of the copper foil $t_c$ that minimizes the AC resistance $r_1$ of the coil may be determined to be 12 Oz (1 Oz indicates 35 um), and at this time a minimum AC resistance $r_1$ of the side coils becomes 234 mΩ.

The width of the copper foil we that minimizes the AC resistance $r_1$ of the coil may be determined to be 0.4 mm while fixing the thickness of the copper foil $t_c$ to be 12 Oz. and at this time a minimum AC resistance $r_1$ of the side coils becomes 224 mΩ.

So, the coil may be finally designed such that the thickness of the copper foil $t_c$ is 12 Oz and width of the copper foil $w_c$ is 0.4 mm.

Figure 8:
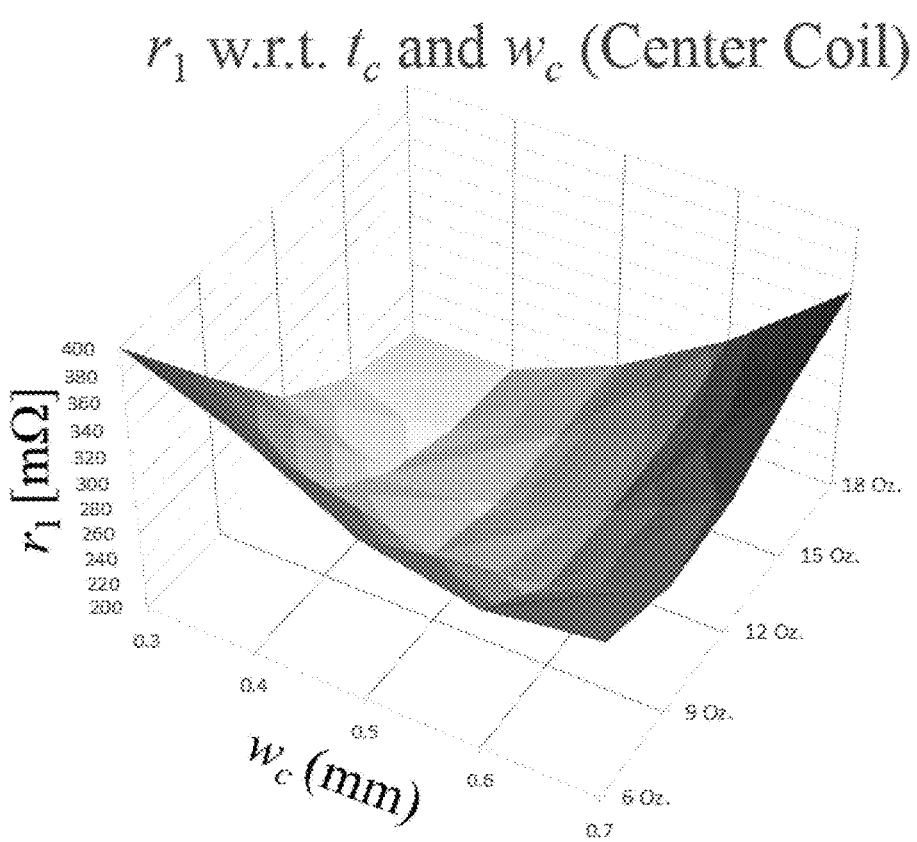
FIGS. 8 and 9 are graphs showing AC resistances according to a combination of a thickness and a width of a coil.
Figure 9:
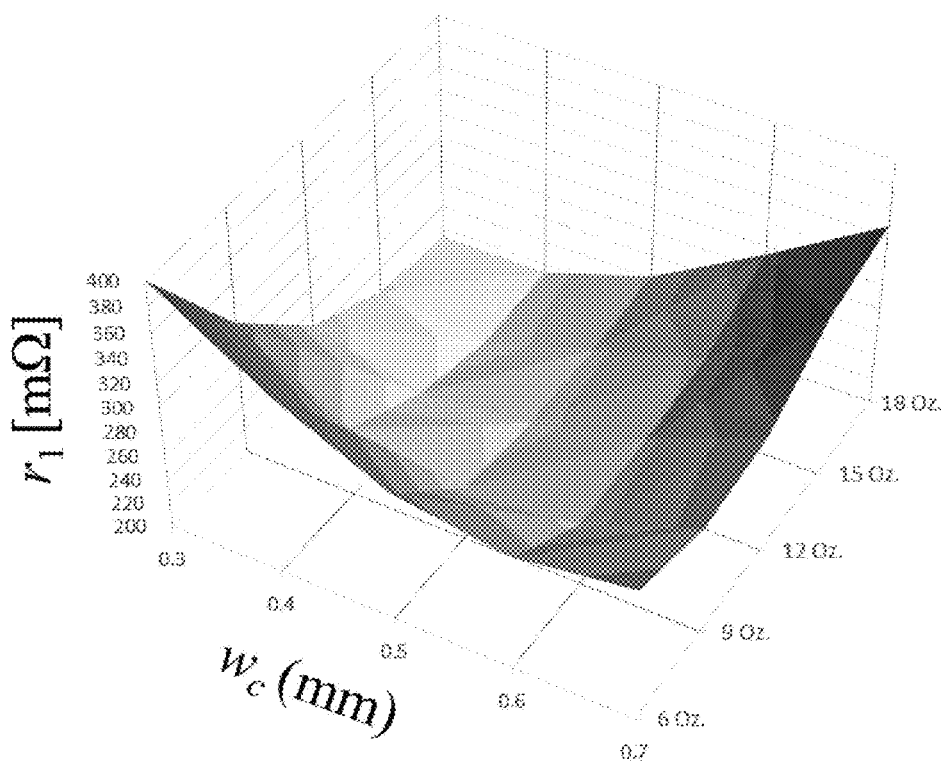

FIGS. 8 and 9 are graphs showing AC resistances according to a combination of a thickness and a width of a coil. FIG. 8 is a graph showing the results of measuring the AC resistance of the center coil while changing the thickness and the width of the copper foil, and FIG. 9 is a graph showing the results of measuring the AC resistance of the side coils while changing the thickness and the width of the copper foil FIGS. 10 and 11 show a combination of the thickness and the width of the coil satisfying the AC resistance of a predetermined reference in a table. FIG. 10 is for the center coil and FIG. 11 is for the side coils.

In FIG. 10, the shaded portion indicates the thickness and width of the copper foil satisfying the AC resistance of the center coil in the range of 200 to 320 mΩ. In FIG. 11, the shaded portion indicates the thickness and width of the copper foil satisfying the AC resistance of the side coils in the range of 200 to 300 mΩ.

When the thickness $t_c$ of the copper foil is 9 to 18 Oz and the width $w_c$ of the copper foil is 0.4 to 0.6 mm, the AC resistance of the coil is about 200 to 300 mΩ.

Figure 12:
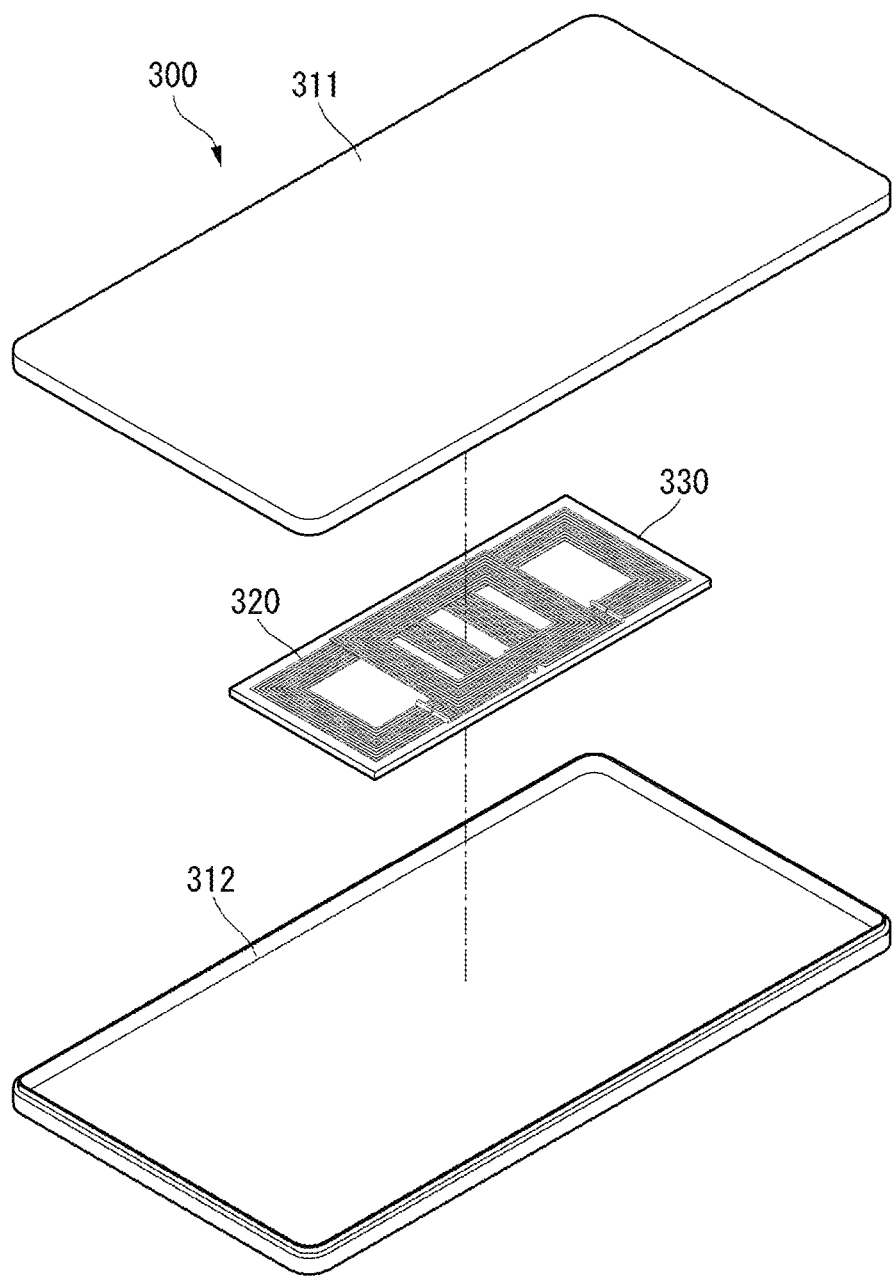
FIG. 12 shows an exploded perspective view of a charger having a transmitting coil according to the present invention.

FIG. 12 shows an exploded perspective view of a charger having a transmitting coil according to the present invention.

The charger 300 in FIG. 12 may include a wireless power transmitting apparatus that provides inductive power. On the upper surface of the charger, an electronic device including the power receiving device to be charged is placed, and a seating surface having an operation area may be formed. When the electronic device is placed on the seating surface, the charger may detect this and start wireless charging.

In the charger 300, the transmitting coil 320 designed in the process of FIG. 7 may be mounted between a front case 311 and a rear case 312, and a shielding part 330 may be formed under the transmitting coil 320. That is, the shielding part 330 may be formed between the rear case 312 and the transmitting coil 320 of the charger 300 and may be formed so as to at least partially exceed the outer periphery of the transmitting coil 320.

The shielding part 330 may prevent elements such as a microprocessor, a memory, and the like formed on a circuit board (not shown) from being affected by electromagnetic effects due to the operation of the transmitting coil 320, or prevent the transmitting coil 320 from being affected by the electromagnetic effects due to the operations of the elements mounted on the circuit board. The shielding part 330 may be made of stainless steel or titanium which does not require plating.

The charger 300 may have a structure in which a power conversion unit including a transmitting coil, a communication unit, a control unit, a power supply unit, and the like are provided in one body. Or, the charger 300 may a structure in which a first body to which the transmitting coil 320 and the shielding part 330 are mounted is separated from a second body including the power conversion unit, the communication unit, the control unit, the power supply unit, and the like for controlling the operation of the transmitting coil 320.

And, the body of the charger 300 may be provided with an output unit such as a display or a speaker, a user input unit, a socket for supplying power, or an interface for coupling external equipment. The display may be formed on the upper surface of the front case 311, and the user input unit, the socket, or the like may be disposed on the side surface of the body.

Throughout the description, it should be understood by those skilled in the art that various changes and modifications are possible without departing from the technical principles of the present invention. Therefore, the technical scope of the present invention is not limited to the detailed descriptions in this specification but should be defined by the scope of the appended claims.

What is claimed is:

1. A method of designing coils for transmitting or receiving power wirelessly, the method comprising:
    (a) determining a length and a width of a core on which a first coil and second and third coils are disposed, each of the second and third coils overlapping one side of the first coil, and determining radii and a number of turns of the first to third coils, in consideration of a target inductance of the first to third coils;
    (b) determining an operating frequency of the coils and a thickness of the core, in consideration of a target output power and an amplitude of a magnetic flux density when driving the coils in order to wirelessly transmit the power;
    (c) determining a desired thickness of a foil constituting the first to third coils, by measuring AC resistances of the first to third coils while changing a thickness of the foil; and
    (d) determining a desired width of the foil, by measuring the AC resistances of the first to third coils while changing a width of the foil,
    wherein the desired thickness and width of the foil which make the AC resistances 200 mΩ to 300 mΩ are 9 Oz to 18 Oz and 0.4 mm to 0.6 mm, respectively, when satisfying that the target inductance of the first to third coils is 11 µH, the length and width of the core are 92 mm and 56 mm, respectively, the radii are 22 mm, the number of turns is 11, the target output power is 15 W, the operating frequency is 111 kHz, and the thickness of the core is 1.5 mm, where 1 Oz is 35 um.

2. The method of claim 1, wherein the (c) step changes the thickness of the foil in a state that a same height difference between a first foil of the first coil and a second foil of the second or third coil maintains.

3. The method of claim 1, wherein the (d) step changes the width of the foil in a state that a same distance between adjacent foils maintains.

4. The method of claim 1, wherein a same inductance of the coils is used in the determining (c) or (d) even if the thickness of the foil is changed or the width of the foil is changed.

5. The method of claim 1, wherein the first to third coils are formed in a double-sided PCB (Printed Circuit Board) manufacturing method where the first coil and the second or third coils are overlapped.

6. The method of claim 1, wherein the first to third coils are wound in spiral way in a circular or rectangular shape.

7. The method of claim 1, wherein the first to third coils are disposed in a longitudinal direction of the core, and
the second coil and the third coil are arranged to partially overlap with the first coil on opposite sides of the first coil.

* * * * *